United States Patent

Ogawa et al.

[11] Patent Number: 5,285,483
[45] Date of Patent: Feb. 8, 1994

[54] PHASE SYNCHRONIZATION CIRCUIT

[75] Inventors: Takao Ogawa; Takeshi Kawasaki, both of Suwa, Japan

[73] Assignee: Seiko Epson Corporation, Tokyo, Japan

[21] Appl. No.: 896,083

[22] Filed: Jun. 8, 1992

Related U.S. Application Data

[63] Continuation of Ser. No. 844,603, Apr. 7, 1992.

[51] Int. Cl.$^5$ ............................................. H03D 3/24
[52] U.S. Cl. .................................... 375/120; 375/119; 455/264
[58] Field of Search ................. 375/119, 120; 370/108; 360/50.1; 455/260, 264, 183.1, 182.1, 192.1

[56] References Cited

U.S. PATENT DOCUMENTS

| | | | |
|---|---|---|---|
| 4,633,488 | 12/1986 | Shaw | 375/120 |
| 4,750,193 | 6/1988 | Bailey | 375/120 |
| 4,958,243 | 9/1990 | Chen et al. | 360/51 |
| 4,970,609 | 11/1990 | Cunningham et al. | 360/51 |
| 5,097,489 | 5/1992 | Tucci | 375/120 |
| 5,148,334 | 9/1992 | Takeuchi et al. | 360/51 |

*Primary Examiner*—Curtis Kuntz
*Assistant Examiner*—T. Ghebretinsae
*Attorney, Agent, or Firm*—Raymond J. Werner

[57] ABSTRACT

Voltage controlled oscillator 40 has an oscillation stoppage cancelling circuit 46 and a current/frequency converter circuit 44 which is a ring oscillator made by connecting inverters forming 3 stages like a ring. Oscillation stoppage canceling circuit 46 stops and releases oscillation of the ring oscillator by a control signal RS. One-shot circuit 3 has a pulse width adjusting circuit 60 which is made by cascade-connecting the inverters constituting the ring oscillator of current/frequency converter 44 and inverters having the same characteristics in 3 stages. When the PLL enters a synchronization field, a synchronization field detector 1 issues a detection signal C and an input switch signal SC; a selector circuit 2 selects read data; and oscillation control signal RS starts upon the rise of a pulse $S_{IN}$. Oscillation stoppage cancelling circuit 46 thus stops oscillator 40 and keeps an output $V_{OUT}$ at H level. After a few bytes of the synchronization bit have passed, detection signal C rises and oscillation control timing circuit 50 starts control signal RS upon the rise of the read data. Oscillation restarts, but the time at which the output $V_{OUT}$ falls from H level to L level is delayed by half of the oscillation cycle T due to the delayed quantity of the ring oscillator. On the other NAND, the output SIN starts in synchronization with the rise of the read data RD but it is adjusted to a pulse width which is equal to the half of oscillation cycle T due to the presence of pulse width adjusting circuit 60. Thus, the time of fall of the read data and the time of the restart of oscillation substantially coincide. It is possible to bring the PLL into a synchronization-locked state at high speed without loop filter 30 of high gain.

7 Claims, 8 Drawing Sheets

PHASE SYNCHRONIZATION CIRCUIT

This is a continuation of application Ser. No. 07/844,603 filed on Apr. 7, 1992.

FIELD OF THE INVENTION

This invention relates to phase synchronization circuits (PLL circuit) generating clocks synchronized with the phase of an input signal and, more specifically, it relates to phase synchronization circuits which are suitable for data separating circuits in magnetic disk devices such as a floppy disk.

BACKGROUND OF THE INVENTION

The format of the input data (read data) of phase synchronization circuits of magnetic disk devices such as a floppy disk consists of a synchronization field (SYSC) having synchronization beats of equally spaced pulsed strings at a heading portion between adjacent juncture fields (GAP) and an information field (an index field (ID) and a data field (DATA)) having synchronization beats and data beats which follow the synchronization field. Therefore, whilst the PLL circuit is locked by operating the synchronization field preceding the information field so as to bring the PLL circuit into a synchronization-locked state, the PLL circuit operates so as to continue to keep the synchronization at the same repetition frequency in the information field. A PLL circuit in a floppy disk device, such as that disclosed in Japanese Patent Publication Number S 58-50827 is well known. In this phase synchronization circuit, when the read data (RD), reproduced by a floppy disk device, is in the synchronization field within that sector, in order to bring the PLL circuit itself into a synchronization-locked state, a frequency and phase comparator and a low pass filter (LPF) with a high gain are chosen such that synchronization beats are followed at high speed, and when the read data RD is in the data field, a phase comparator which compares phases only and a low pass filter with a low gain which does not follow the peak shift of the data beats, are chosen because the PLL circuit has already been in synchronization. In the method wherein the combination of the frequency and phase comparator and the low pass filter with a high gain and the combination of the phase comparator and the low pass filter with a low gain are controlled to be switched between the synchronization fields and the data fields, there is provision for avoiding erroneous locking and increasing the speed of lock-in operation or stabilizing the reading operation.

Problems with the PLL circuits according to the above configuration are described below.

Since a frequency and phase comparator are required, a low pass filter must be provided after each of them. In general, the low pass filter is a lag lead filter which is equivalent to a charge pump in front of it with regard to circuit correlation and is a series circuit comprising a resistor element and a capacitor element but if a plurality of low pass filters are used, they will consume a large part of the space for both packaging because the number of discrete parts will increase. When the phase synchronization circuit is implemented on a single semiconductor integrated circuit chip, the size of the chip will increase because a plurality of low pass filters must be formed.

When a two-seven RLL recording method wherein the frequency of synchronization beats and the oscillation frequency of a voltage controlled oscillator which is frequency-controlled by the output potential of a low pass filter are different, is employed, it is not possible to simply use a frequency and phase comparator as it is.

SUMMARY OF THE INVENTION

This invention causes lock-in at high speed by using only a phase comparator instead of a frequency and phase comparator to achieve the first objective of eliminating the components of the frequency and phase comparator and a low pass filter with a high gain to reduce the space for the packaging and the size of a semiconductor chip and the second objective of providing phase synchronization circuits which can be used even in the case that the frequency of synchronization beats and the oscillation frequency of a voltage controlled oscillator are different.

In order to solve the above problems, this invention employs the method of dual-phase start wherein the oscillation of a voltage controlled oscillating means is restarted after being stopped once at a synchronization field when switch over from the reference clock to the read data occurs, and it is characterized in that the configuration of the voltage controlled oscillating means and a one-shot circuit has been improved in order to achieve the synchronization of the read data and the phase of an oscillation output at high speed. Specifically, phase synchronization circuits having a one-shot circuit for converting an incoming signal into a predetermined pulse, a phase comparing means for comparing the output thereof, as a first input signal, with a second input signal, a loop filter means for voltage-converting the output of the phase comparing means, and a voltage controlled oscillating means which is controlled by the output voltage of the loop filter means with regard to its oscillation frequency and which transmits an oscillation output as the signal source of the second input signal, this invention is characterized in that it is equipped with an oscillation controlled timing means for generating an oscillation controlled signal synchronized with the first input signal according to an external control signal and the first input signal; the voltage controlled oscillating means has a ring oscillator comprising inverter circuits of M (odd number) stages connected like a ring and an oscillator disable circuit for fixing the output level of the ring oscillator in response to assertion of the oscillation controlled signal; the one-shot circuit has a pulse width adjusting means for varying the pulse width by the output voltage of the loop filter means; and the pulse width adjusting means is a delaying means which is made by cascade-connecting the inverter circuits constituting the ring oscillator and another set of inverter circuits with the same characteristics at the stages of the same odd numbers. In such configuration, when the PLL circuit comes into a synchronization field, the generation of the external control signal causes the oscillation control timing means to generate the oscillation controlled signal which is synchronized with the external control signal. When the oscillation controlled signal is generated, the oscillator disable circuit stops the oscillation of the voltage controlled oscillating means. Since the period of the oscillation stoppage is short (a few bytes), the output voltage of the loop filter means is kept at a value which is equal to the value immediately before the oscillation stoppage. When a predetermined time has passed after the stoppage of oscillation, the logic of the oscillation controlled signal is inverted and the oscillation of the voltage controlled oscillation means restarts. However, since the voltage controlled oscillating means is a ring oscillator comprising inverter circuits of I (odd number) connected like a ring, the time of the inversion of the logic of an oscillation output $V_{OUT}$ is delayed by T/2 which is half of an oscillation cycle T, due to the amount of the delay of the ring oscillator circuit. The output of the one-shot circuit also varies. Since the one-shot circuit has the pulse width adjusting means for varying the pulse width by the output voltage of the loop filter means, and the pulse width adjusting means is a delaying means which is made by cascade-connecting the inverter circuits constituting the ring oscillator and another set of inverter circuits with the same characteristics at the stages MM (odd number), the output pulse width of the one-shot circuit is adjusted to a pulse width which is equal to T/2 which is half of the oscillating cycle T. Accordingly, the phases of the two inputs of the phase comparing means substantially coincide or approximate each other. Therefore, it is possible to bring the phase synchronization circuit into a synchronization-locked state without a high gain at a loop filter 30. It is also possible to synchronize the phases when the frequencies of the first input signal and the second input signal are different. Further, since both of the pulse widths of the one-shot circuit and the oscillation frequency of the voltage controlled oscillating means vary in accordance with the value of the output voltage of the loop filter means, it is possible to have the reduction of a peak shift margin against the fluctuation of the rotation of disk devices.

As a specific configuration of the oscillator disable circuit, a transmission circuit and a voltage fixing switching circuit which are interposed between the inverter circuits at Kth and (K+1)th stages and transmits a signal from the Kth stage to the (K+1)th stage, where K is one of natural numbers from 1 through M−1. As the above delaying means in such a case, it is desirable to use the equivalent circuit configuration which comprises identical circuit elements corresponding to the transmission circuit and the voltage fixing switching circuit of the oscillator disable circuit and which is energized fixedly using them as a power source, in order to synchronize the delay time of them more accurately.

As another configuration of the oscillator disable circuit, it is possible to employ a transmission circuit and a voltage fixing switching circuit which are provided at the stage preceding the first stage inverter circuit and which transmits a signal from the final stage to the first stage.

Other objects, advantages and attainments together with a fuller understanding of the invention will become apparent and appreciated by referring to the following description and claims taken in conjunction with the accompanying drawings.

DETAILED DESCRIPTION OF THE INVENTION

Embodiment 1

Figure 1:
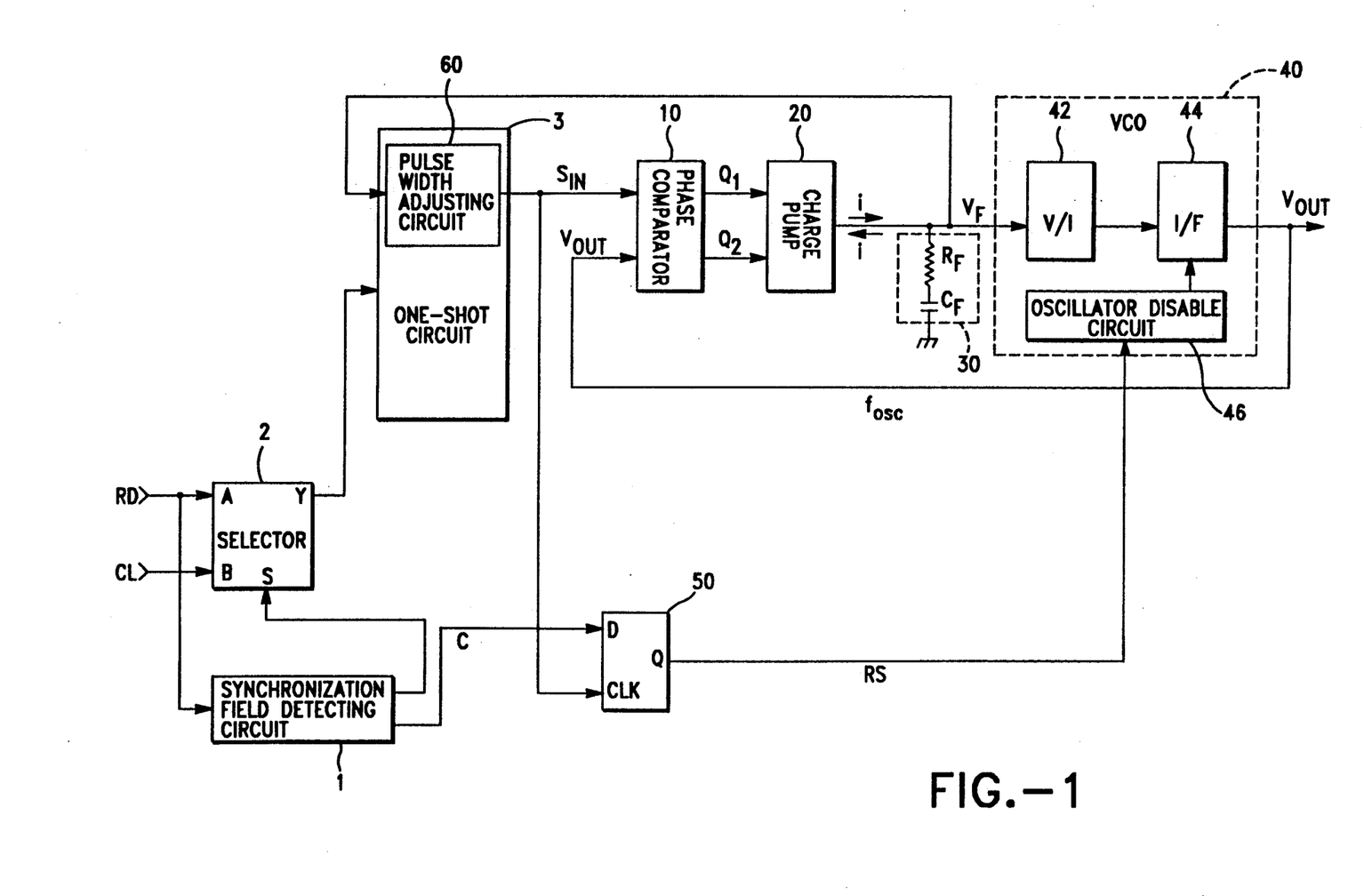
FIG. 1 is a block diagram which schematically shows the configuration of a first embodiment of the present invention.

FIG. 1 is a block diagram which schematically shows the configuration of a phase synchronization circuit according to an embodiment 1 and an embodiment 2. This PLL circuit has a synchronization field detector circuit 1, a selector circuit 2, a one-shot circuit 3, a phase comparator 10, a charge pump 20, a low gain loop filter 30, a voltage controlled oscillator (VCO) 40 and an oscillation controlled timing circuit 50.

Synchronization field detecting circuit 1 detects that read data RD comprises only synchronization bits of synchronization fields. This circuit normally comprises a counter which counts a few bytes (1 or 2 bytes) of equally spaced synchronization bits. When synchronization field detecting circuit 1 detects a synchronization field, it outputs a detection signal C and an input switch control signal SC. Selector circuit 2 exclusively selects the read data RD and reference clocks CL according to the input switch control signal SC. The selected signal is supplied to one-shot circuit 3. One-shot circuit 3 converts every incoming signal into square pulses with a predetermined pulse width and the widths of such pulses are variably adjusted by a pulse width adjusting circuit 60 as described later.

Phase comparator 10 compares the phase of an input signal $S_{IN}$ and an oscillation output $V_{OUT}$ of VCO 40 and outputs a phase lag difference signal $Q_1$ and a phase lead difference signal $Q_2$. Charge pump 20, supplies a charge/discharge current I to a capacitor $C_F$ of loop filter 30 according to the phase lag difference signal $Q_1$ and phase lead difference signal $Q_2$. Loop filter 30 is a low gain, low pass filter (LPF) constituting a lag lead filter which is equivalent to charge pump 20 within the sense of circuit correlation. Voltage controlled oscillator 40 has a filter output voltage $V_F$ as its control input and converts it to an oscillation output $V_{OUT}$ of an oscillation frequency $F_{OSC}$ according to the value of the filter output voltage. VCO 40 has a voltage-current convergence circuit (hereinafter referred to as V/I circuit) 42, a current/frequency conversion circuit (hereinafter referred to as I/F circuit) 44 and an oscillator disable circuit circuit 46. An oscillation control timing circuit 50 synchronizes a detection signal C from the synchronization field detecting circuit 1 with an output $S_{IN}$ of one-shot circuit 3 to generate an oscillation control signal RS and is constituted by a D flip-flop circuit.

Figure 2:
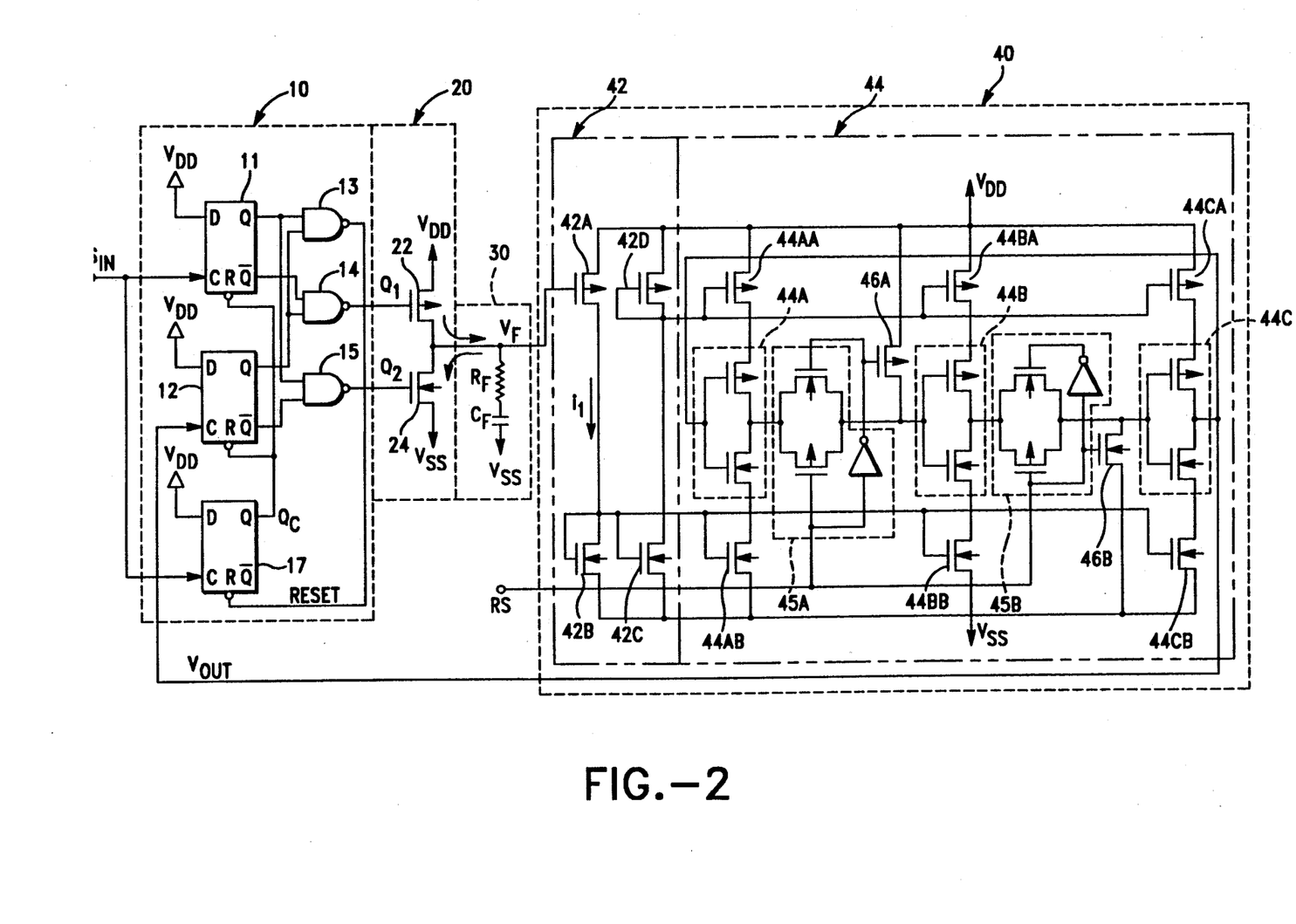
FIG. 2 is a circuit diagram showing the configuration of a phase comparator, a charge pump and a voltage controlled oscillator of a first embodiment of the present invention.

Phase comparator 10 is a digital phase comparator and, as shown in FIG. 2, it is constituted by a D flip-flop 11 which has the input signal $S_{IN}$ as a clock input, a D flip-flop 12 which has the oscillation output $V_{OUT}$ as a clock input, a NAND gate 13 which creates a reset signal R for D flip-flops 11 and 12 from Q outputs thereof, NAND gate 14 which creates the phase lag difference signal $Q_1$ from the Q (bar) output of D flip-flop 11 and the Q output of D flip-flop 12, a NAND gate 15 which creates the phase lead difference signal $Q_2$ from the Q output of D flip-flop 11 and the Q (bar) output of the D flip-flop 12, and D flip-flop 17 which has the input signal $S_{IN}$ and the output of the NAND gate 13 as a clock input and a reset signal (R e s e t) respectively and supplies $Q_C$ output to the reset time levels of D flip-flops 11,12. When the input signal $S_{IN}$ is input, the $Q_C$ output of D flip-flop goes to H level and thereby D flip-flops 11, 12 assume the active state. The falling edge of the oscillation output $V_{OUT}$ is ignored except for the case where the input signal $S_{IN}$ is input and the $Q_C$ output is at H level. Therefore, phase comparison circuit 10 does not perform phase comparison for every oscillation output $V_{OUT}$.

Charge pump 20 is a series circuit comprising a switching MOSFET 22 for charging which enters an ON state when the phase lag difference signal $Q_1$ is at L level and a switching MOSFET 24 for discharging which turns ON when the phase lead difference signal $Q_2$ is at H level.

Loop filter 30 which is a low pass filter constitutes a lag lead filter which is equivalent to charge pump 20 in the sense of circuit configuration, and is an equivalent series circuit comprising a resistor $R_F$ and a capacitor $C_F$. Loop filter 30 is constituted by a low gain filter such that it will not follow phase fluctuation such as a peak shift of the data bits.

V/I circuit 42 of VCO 40 is a current mirror circuit constituted by a P-type MOSFET 42a as a current source to supply a current according to the value of the filter output voltage $V_F$, and N-type MOSFET 42b at the input side which is in series therewith, an N-type MOSFET 42c at the output side supplying an output side current at a value which is substantially equal to a current value $i_1$ at the input side, and a P-type MOSFET 42d which is cascade-connected thereto. I/F circuit 44 of VCO 40 is a ring oscillator circuit made by connecting, like a ring, inverter circuits 44a, 44b, 44c which are connected to form 3 stages and the current flowing through which is determined by the output current of the current mirror circuit. Specifically, a P-type MOSFET 44aa which is in parallel with the P-type MOSFET 42d and an N-type MOSFET 44ab which is in parallel with the N-type MOSFET 42c are connected to the inverter circuit 44a in series. A P-type MOSFET 44ba which is in parallel with P-type MOSFET 42d and an N-type MOSFET 44bb which is in parallel with N-type MOSFET 42c are connected to inverter circuit 44b in series. In addition, a P-type MOSFET 44ca which is in parallel with P-type MOSFET 42d and an N-type MOSFET 44cb which is in parallel with N-type MOSFET 42c are connected to inverter circuit 44c in series. There are a transmission circuit 45a for transmitting and cutting off the signal from the first stage to the second stage according to the oscillation control signal RS and a voltage fixing MOSFET 46a for fixing the input voltage of the second stage inverter circuit 44b between first stage inverter circuit 44a and second stage inverter circuit 44b. There are a transmission circuit 45b for transmitting and cutting off the signals from the second stage to the third stage according to the oscillation control signal RS and a voltage fixing MOSFET 46b for fixing the input voltage of third stage inverter circuit 44c between second stage inverter circuit 44b and third stage inverter circuit 44c. Transmission circuits 45a, 45b and voltage fixing MOSFET 46a, 46b for fixing constitute oscillator disable circuit 46.

Figure 3:
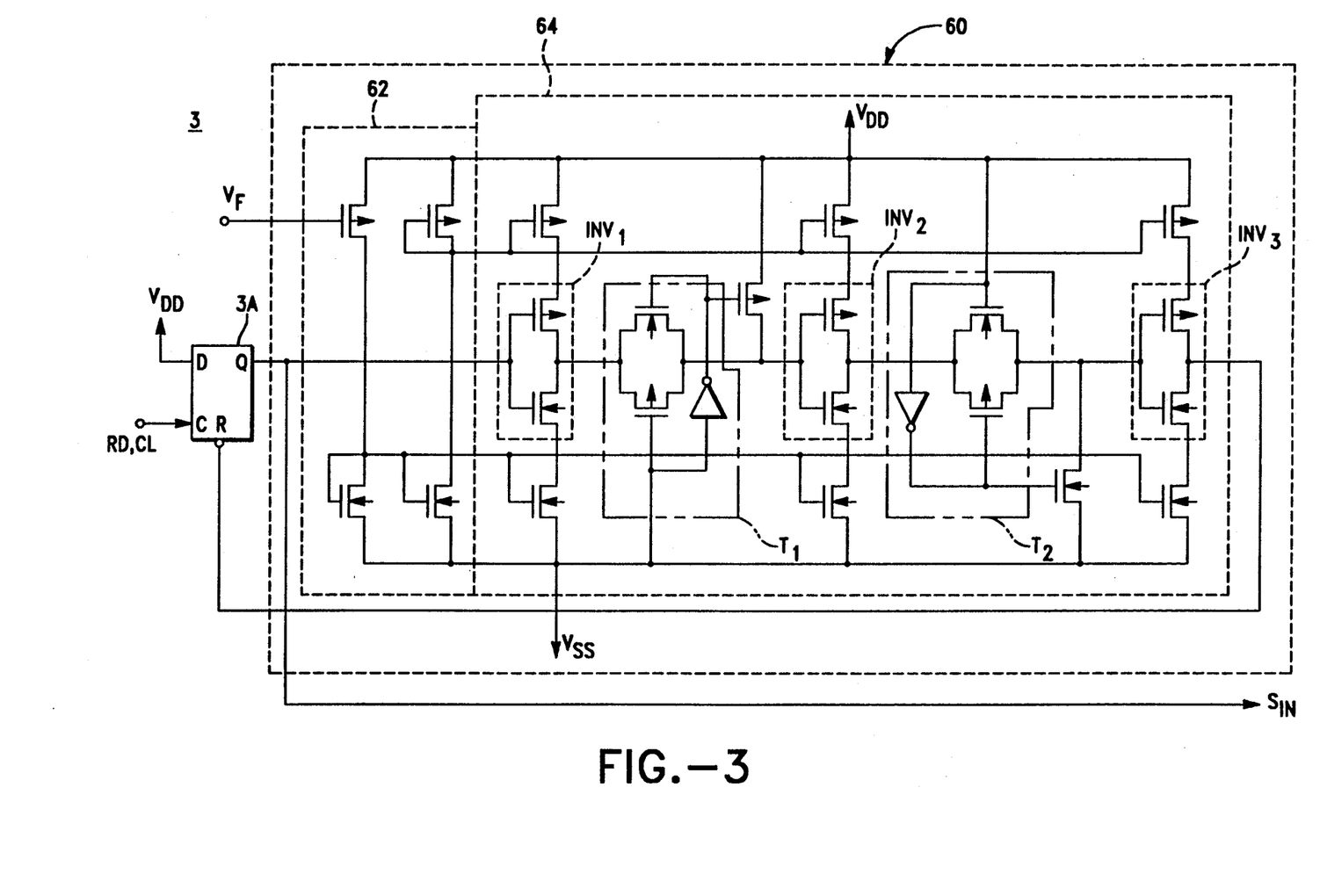
FIG. 3 is a circuit diagram showing the configuration of a one-shot circuit of a first embodiment of the present invention.

As shown in FIG. 3, one-shot circuit 3 is made up of a D flip-flop circuit 3a which has the read data RD or reference clocks CL from selector circuit 2 as a clock input and a pulse width adjusting circuit 60 which values the pulse width of the output Q thereof according to the value of a filter output $V_F$ of loop filter 30. The circuit components of pulse width adjusting circuit 60 are identical to those of VCO 40 and are the same as those made by connecting transmission circuits 45a, 45b to power sources $V_{SS}$ and $V_{DD}$ respectively. Specifically, pulse width adjusting circuit 60 is made up of a voltage/current conversion circuit 62 comprising a current mirror circuit and a delay circuit 64 which provides a pulse delay quantity according to the value of the converted current thereof. Delay circuit 64 is made by cascade-connecting inverter circuits $INV_1$–$INV_3$, having the same characteristics as those of the inverter circuits of VCO 40. The transmission circuit $T_1$ interposed between the first stage inverter circuit $INV_1$ and the second stage inverter circuit $INV_2$ is connected to $V_{SS}$ and is ready to transmit signals at all times. A transmission circuit $T_2$ interposed between the second stage inverter circuit $INV_2$ and the third stage inverter circuit $INV_3$ is connected to $V_{DD}$ and it is also ready to transmit signals at all times.

When a junction field (GAP) is encountered when a floppy disk is reproduced, since synchronization field detecting circuit 1 does not detect a synchronization field, selector circuit 2 selects the reference clocks CL. In this period, the PLL circuit is in synchronization with the reference clocks. Specifically, since the oscillation control signal RS is at L level, transmission circuits 45a, 45b are set to a potential transmission mode and, since potential fixing MOSFETs 46a, 46b are in an OFF state, three-stage-connected inverter circuits 44a, 44b, 44c form a normal ring oscillator and transmits an oscillation output of 50% duty ratio in synchronization with the reference clocks of VCO 40.

Next, when a synchronization field (SYSC) is encountered, synchronization field detecting circuit 1 outputs a detection signal C at H level after a few bytes (1 or 2 bytes) of the synchronization bits. An input switch signal SC is also generated and selector circuit 2 selects read data RD. Detection signal C is supplied to oscillation control timing circuit 50 while, as shown in FIG. 3, the oscillation control signal RS starts upon the rising edge of the read data RD that is the pulse $S_{IN}$ of one-shot circuit 3. When the oscillation control signal RS starts, transmission circuits 45a, 45b are disconnected and potential fixing MOSFETs 46a, 46b will be in the ON state. At this time, the input voltage of second stage inverter circuit 44b becomes H level ($V_{DD}$), and the input voltage of third stage inverter circuit 44c is fixed to L level ($V_{SS}$). As a result, the oscillation of VCO 40 is stopped and the output $V_{OUT}$ is kept at H level. The loop filter output $V_F$ is fixed to a predetermined value just before the oscillation stoppage. This is because the PLL circuit is in synchronization with the reference clocks CL for a few bytes of the synchronization field (SYSC). The value of the loop filter output $V_F$ can be considered to be constant for the period of the oscillation stoppage (a few bytes of the synchronization bits). This is because the period is so short that the leakage current from loop filter 30 can be ignored.

Next, when a few bytes of the synchronization bits are detected by synchronization field detecting circuit 1 after the oscillation stoppage, the detection circuit C starts. Oscillation control timing (50) drops the oscillation control signal RS upon the rising edge of the read data RD. Oscillation of VCO 40 is then restarted, but the time when the oscillation output $V_{OUT}$ drops from H level to L level is delayed by T/2 which is the half of the oscillation cycle T due to the quantity of the delay of the ring oscillator circuit comprising inverter circuits 44a, 44b, 44c forming three stages. Output $S_{IN}$ of one-shot circuit 3 also starts in synchronization with the rise of the read data RD, but it is adjusted to a pulse width equal to T/2 which is the half of oscillation cycle T due to the presence of pulse width adjusting circuit 3b of one-shot circuit 3. Thus, the time when the read data RD falls and the time when the oscillation restarts substantially coincide. This is because the delay quantity of pulse width adjusting circuit 3b is determined by the inverter circuits $INV_1$-$INV_3$ forming three stages according to the filter output $V_F$ of loop filter 30 just as in VCO 40.

Thus, when the oscillation of VCO 40 is started, there is a small difference between the delay quantity of half the cycle of the ring oscillator comprising inverter circuits 44a, 44b, 44c forming three stages and the delay quantity of the inverter circuits $INV_1$, $INV_2$, and $INV_3$ forming three stages and, therefore, it is possible to bring the phase synchronization circuit into a synchronization-locked state at high speed without loop filter 30 of a high gain.

Figure 4:
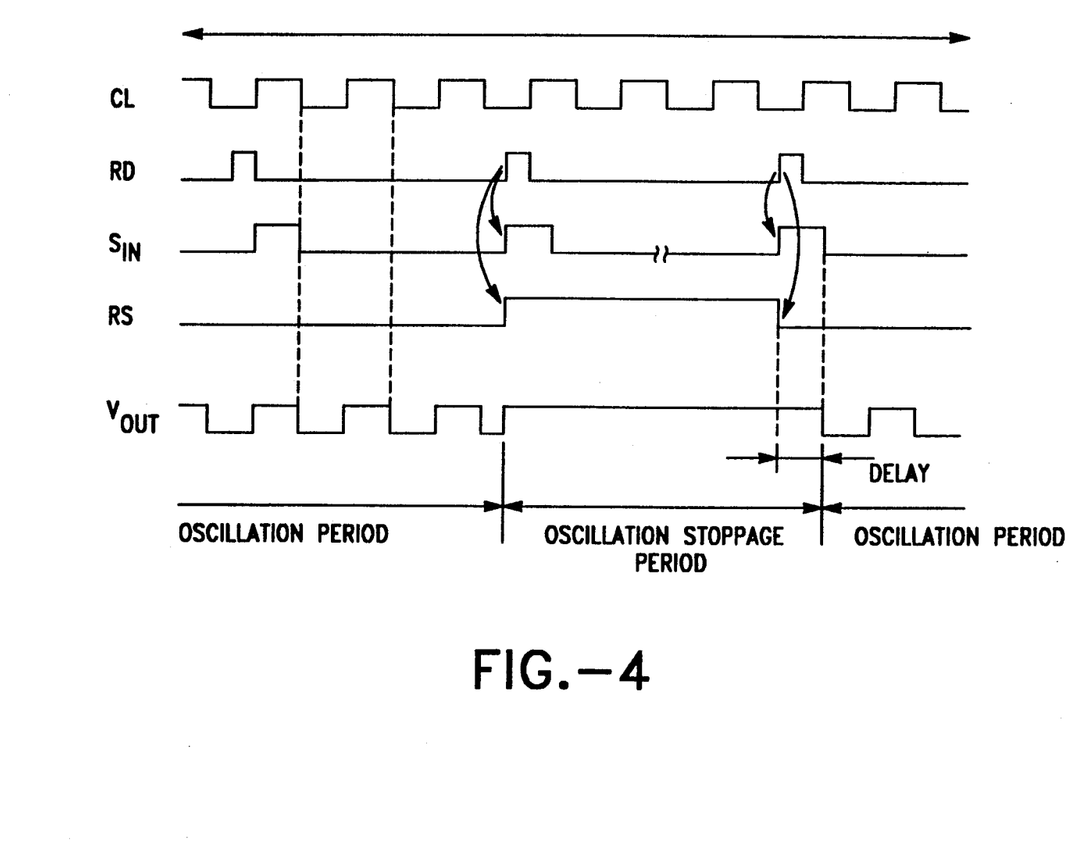
FIG. 4 is a timing chart showing the waveforms of various signals in the case of a synchronization field in a first embodiment of the present invention.
Figure 5:
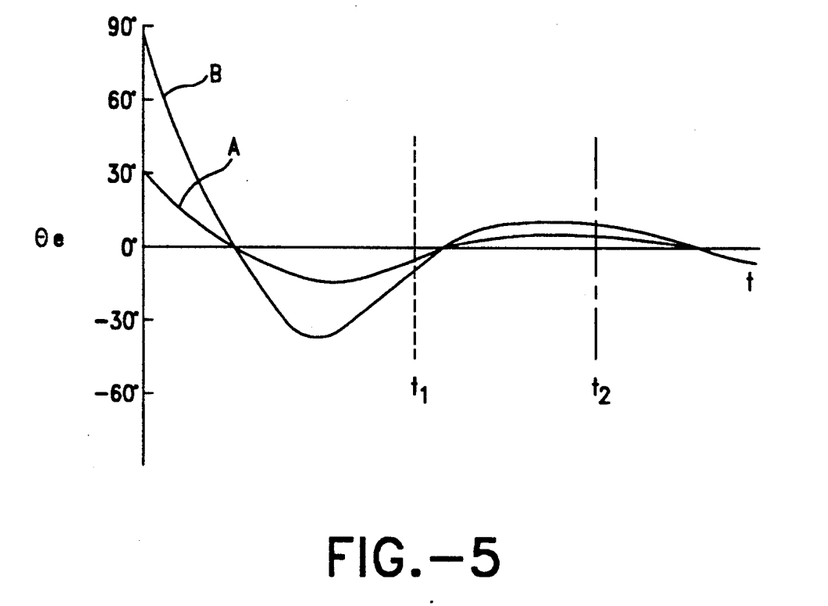
FIG. 5 is a graph showing a phase step response in a first embodiment of the present invention and a phase step response in the prior art.

FIG. 4 is a graph showing a phase step response. In this graph, the axis of abscissa and the axis of ordinate represent time t and a phase difference $\theta_\theta$ respectively. A is a phase step response in this embodiment, and B is a phase step response in the conventional phase synchronization circuit. Each phase step response is that obtained when a low gain loop filter is Used. In general, a phase step response is expressed by the following equation.

$$\theta_e = \Delta\theta \left( \cos\sqrt{1-\zeta^2}\,\omega_n t - \frac{\zeta}{\sqrt{1-\zeta^2}}\sin\sqrt{1-\zeta^2}\,\omega_n t \right) e^{-\omega_n t}$$

Where $\Delta\theta$ is an initial phase difference; $\omega_n$ is a natural angle frequency; and $\zeta$ is a damping coefficient. In FIG. 5, $\omega_n = 80 \times 10^3$ rad/sec, and $\zeta = 0.4$. Since the time of the restart of the oscillation coincides with the fall of the input signal $S_{IN}$ the initial phase difference $\Delta\theta$ is theoretically 0°, and it is assumed to be only 30° at its worst value. In contrast, with the conventional phase synchronization circuit, since the phase difference between the oscillation output $V_{OUT}$ and the input signal $S_{IN}$ is not constant, the initial phase difference $\Delta\theta$ is not constant, the worst value being 90°. Therefore, if we assume that $t_1$ represents the time at which it is possible to consider the response A to have completed the following operation, and $t_2$ represents the time at which it is possible to consider the response B to have completed the following operation, this invention allows to bring the operation into the synchronization-locked state faster. Thus, with the width synchronization circuit according to this embodiment, it is possible to perform a high speed lock-in operation by only using a low gain loop filter. Therefore, it is not necessary to use a high gain loop filter as in the prior art, and, as a result, the number of passive elements constituting the loop filter can be reduced, resulting in reduction in the surface area for board packaging and chip size.

Oscillator disable circuit 46 of VCO 40 is configured between first and second inverter circuits 44a, 44b and between second and third inverter circuits 44b, 44c. Since the output of third stage inverter circuit 44c inevitably has a parasitic load capacitance, the delayed waveform is shaped and stabilized by providing a capacitance which is equal to the parasitic capacitance between the first and second stages and the second and third stages.

The VCO according to this embodiment may be configured using an operational amplifier. It may also be configured so as to start oscillation upon the rise of input signal $S_{IN}$.

Embodiment 2

The configuration of a phase synchronization circuit according to the second embodiment is generally similar to that shown in FIG. 1 except the configuration of the VCO circuit and the one-shot circuit.

Figure 6:
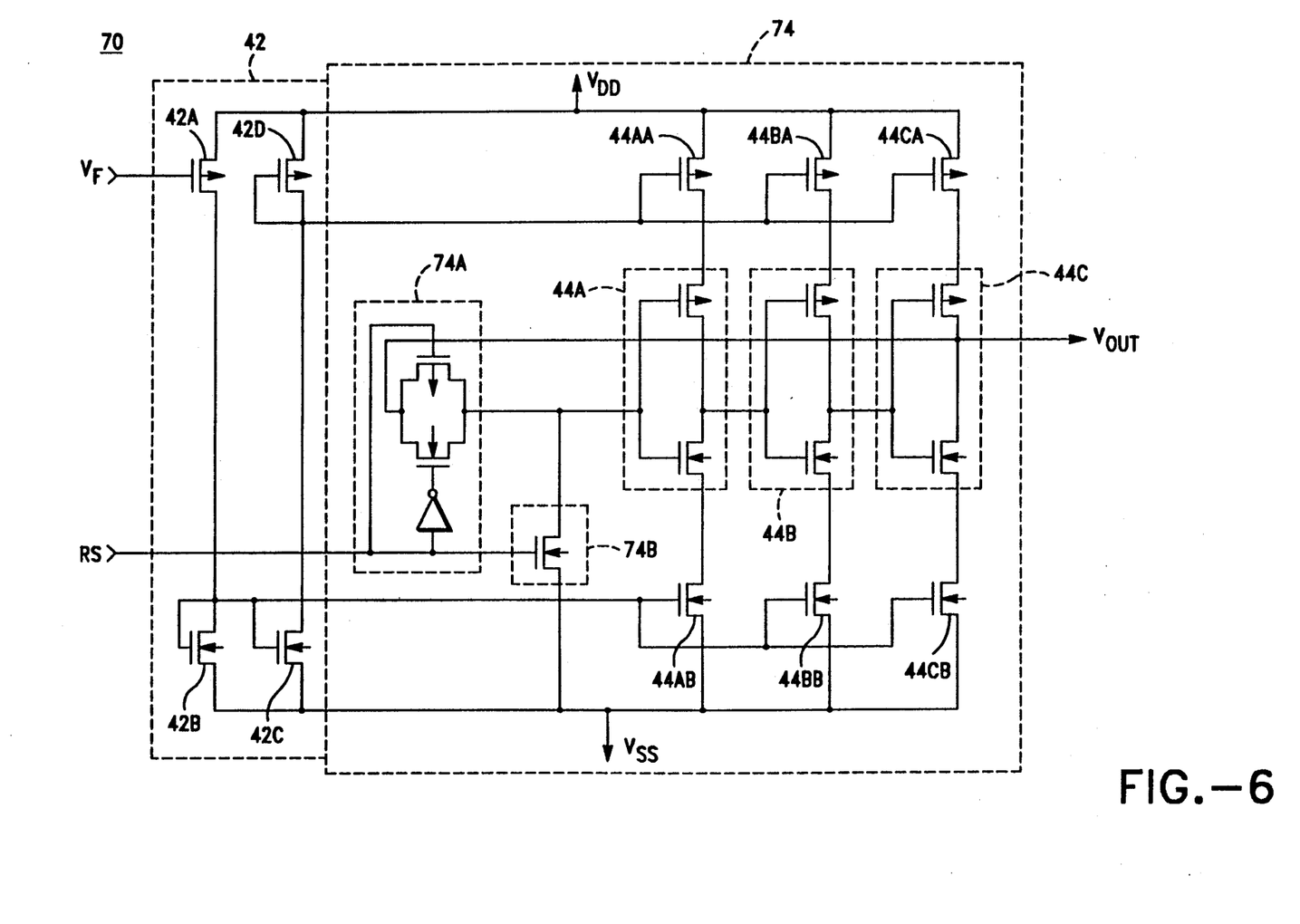
FIG. 6 is a circuit diagram showing the configuration of a voltage controlled oscillator of a second embodiment of the present invention.

FIG. 6 is a circuit diagram showing the configuration of a VCO according to embodiment 2. In FIG. 6, identical reference numbers are given to the parts identical to the constituent parts of the voltage controlled oscillator according to embodiment 1. VCO 70 also has part V/I in circuit 42 and an I/F circuit 74. V/I circuit 42 is a current mirror circuit. I/F circuit 74 comprises a ring oscillator circuit which is made by connecting inverter circuits 44a, 44b, 44c just as I/F circuit 40 of embodiment 1. A transmission circuit 74a and a voltage fixing MOSFET 74b are provided before first stage inverter circuit 44a. Transmission circuit 74a and voltage fixing MOSFET 74b constitute an oscillator disable circuit 46.

When an oscillation control signal RS is at L level, transmission circuit 74a is set to a signal transmission mode, and voltage fixing MOSFET 74b is OFF. On the other hand, when the oscillation control signal RS is at H level, transmission circuit 74a is disconnected and voltage fixing MOSFET 74b is ON.

Figure 7:
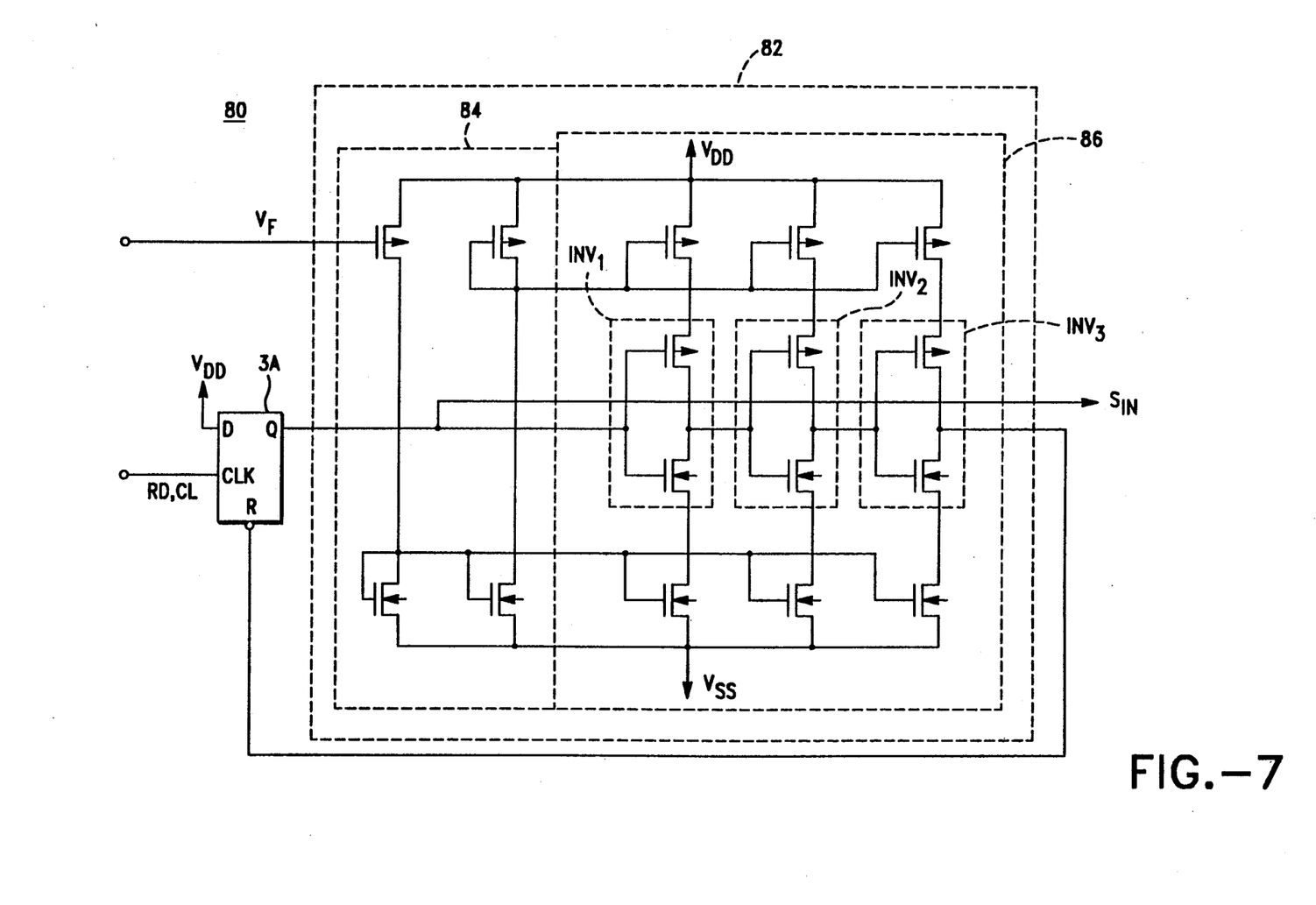
FIG. 7 is a circuit diagram showing the configuration of a one-shot circuit of the second embodiment.
Figure 8:
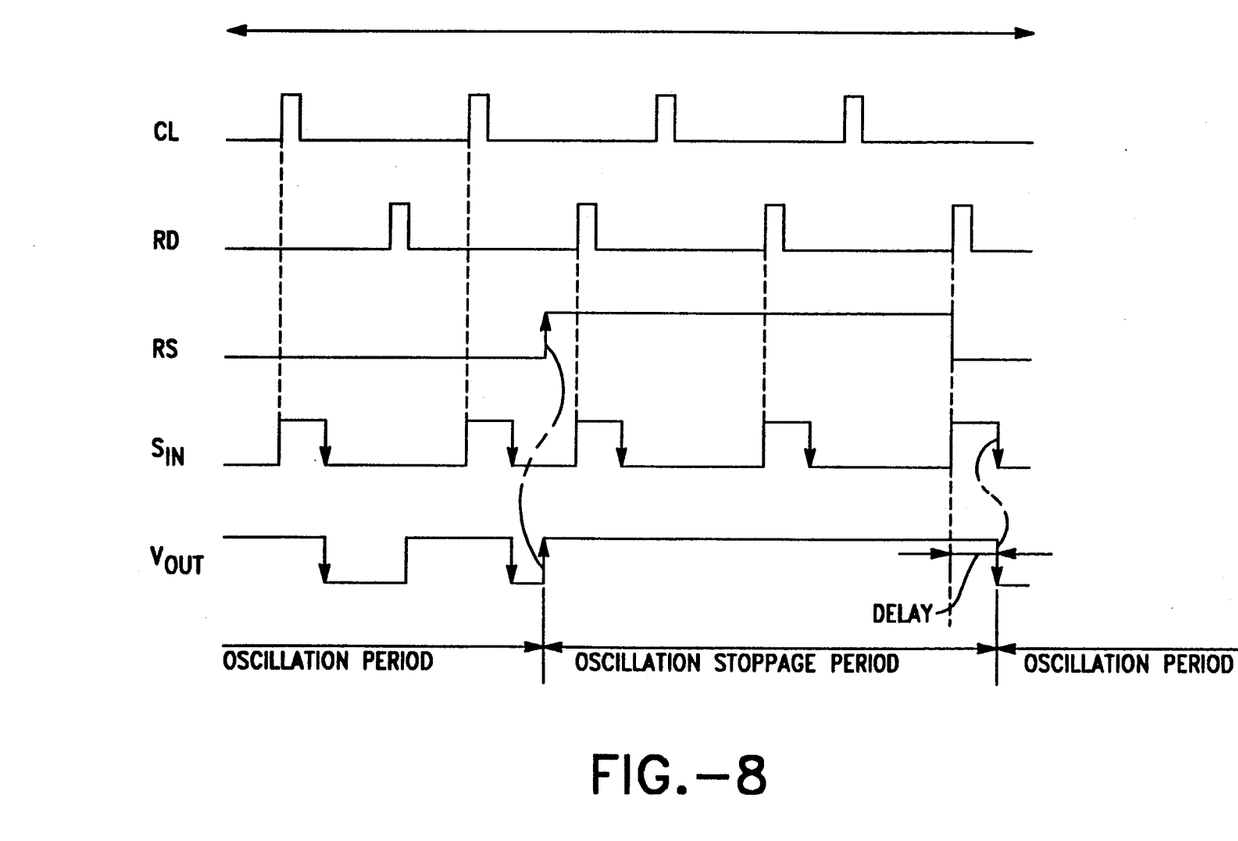
FIG. 8 is a timing chart showing the waveforms of various signals in the case of a synchronization field in the second embodiment.

FIG. 7 is a circuit diagram showing the configuration of a one-shot circuit according to embodiment 2. In FIG. 7, identical reference numbers are given to the parts identical to the constituent parts of the voltage controlled oscillator according to embodiment 1. One shot circuit 80 is also made up of a D flip-flop circuit 3a which has the read data RD or the reference clocks CL from selector circuit 2 as a clock input and a pulse width adjusting circuit 82 which values the pulse width of the output Q thereof according to the value of the filter output $V_F$ of loop filter 30. The circuit components of pulse width adjusting circuit 82 are identical to those of VCO 70 and it is made up of a voltage/current conversion circuit 84 comprising a current mirror circuit and a delay circuit 86 which provides a pulse delay quantity according to the value of the converted current thereof. Delay circuit 86 is made by 3 stage cascade connecting inverter circuits $INV_1$, $INV_2$, and $INV_3$ having the same characteristics as those of the inverter circuits constituting the ring oscillator of VCO 70.

Just as in embodiment 1, when a juncture field (GAP) is encountered when a floppy disk is produced, since the synchronization field detecting circuit 1 does not detect a synchronization bit, selector circuit 2 selects the reference clocks CL. In this period, the PLL circuit is in synchronization with the reference clocks, specifically, since the oscillation control signal RS is at L level, a transmission circuit 74a is set to a potential transmission mode, and a potential fixing MOSFET 24b is OFF and, as a result, the 3-stage connected inverter circuits 44a, 44b, 44c form a normal ring oscillator and transmit an oscillation output of 50% duty ratio in synchronization with the reference clocks of VCO 70.

When a synchronization field circuit (SYSC) is encountered, synchronization field detecting circuit 1 detects a synchronization bit. Synchronization field detecting circuit 1 outputs a detection signal C at H level a few bytes (1 or 2 bytes) after the synchronization bit. An input switch signal SC is also generated, and selector circuit 2 selects the read data RD. When the detection signal C is supplied to oscillation controlled timing circuit 50, the oscillation controlled signal RS starts. When the oscillation control signal RS starts, transmission circuit 74a is disconnected and potential fixing MOSFET 74b will be ON. Since the input voltage of first stage inverter circuit 44a is at L level ($V_{SS}$) at this time, an oscillation output $V_{OUT}$ which is the output of third stage inverter circuit 44c is kept at H level and oscillation will stop. The loop filter output $V_F$ is fixed to a constant value just before the oscillation stoppage. This is because the PLL circuit is in synchronization with the reference clocks CL for a few bytes of the synchronization field (SYSC). The value of the loop filter output $V_F$ can be considered to be constant for the period of oscillation stoppage (a few bytes of the synchronization bit). This is because the period is so short that the leak current of loop filter 30 can be ignored.

Next, when synchronization field detecting circuit 1 detects a few bytes of the synchronization bit after the oscillation stoppage, the detection signal C starts. Oscillation controlled timing circuit 50 drops the oscillation controlled signal RS upon the rise of the read data RD. Oscillation of a VCO 700 restarts at the time when the oscillation output $V_{OUT}$ falls from H level to L level is delayed by T/2 which is the half of the oscillation cycle T due to the delay quantity of the ring oscillator circuit comprising inverter circuits 44a, 44b, 44c forming 3 stages. The output $S_{IN}$ of one-shot circuit 3 also rises in synchronization with the rise of the read data RD, but it is adjusted to a pulse width equal to T/2 which is the half of the oscillation cycle T due to the presence of pulse width adjusting circuit 82 of one-shot circuit 3. Thus, the time of the fall of the read data RD and the time of the restart of oscillation substantially coincide. This is because the delayed quantity of pulse width adjusting circuit 82 is determined by the inverter circuits $INV_1$–$INV_3$ forming 3 stages according to the filter output $V_F$ of loop filter 30 just as in VCO 70.

Thus, when oscillation of VCO 70 is started, there is a small difference between the delay quantity of the half of the cycle or ring oscillator comprising inverter circuits 44a, 44b, 44c forming 3 stages and the delay quantity of inverter circuits $INV_1$, $INV_2$, and $INV_3$ forming 3 stages of one-shot circuit 3 and, as a result, it is possible to bring the phase synchronization circuit into a synchronization-locked state at high speed without loop filter 30 of high gain. Further, it is not possible with the prior art to achieve phase synchronization when the input signal $S_{IN}$ frequency and the oscillation output $V_{OUT}$ frequency are different because a frequency and phase comparator is used in the prior art. However, now it is possible to achieve phase synchronization even in such cases because only a phase comparator and a low gain loop filter are used as in this embodiment. In addition, the one-shot circuit pulse width, and the oscillation frequency of the VCO change in conjunction with the value of the output voltage of the loop filter means just as in embodiment 1, it is possible to halve the reduction in peak shift margin against fluctuation in the rotation of a disk device.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the subjoined claims.

What is claimed is:

1. A phase synchronization circuit comprising:
   a) a one-shot circuit having two input terminals and one output terminal, for producing a pulse of controlled width from an incoming signal;
   b) a phase comparison means for comparing a phase relationship between two signals, having two input terminals and two output terminals;
   c) a charge pump having two input terminals and one output terminal;
   d) a loop filter;
   e) a voltage controlled oscillator (VCO) having two input terminals and one output terminal;
   f) a two-to-one selector circuit, having a first data input terminal coupled to a read data signal, a second data input terminal coupled to a reference clock signal, a control input terminal coupled to a select control signal, and one output terminal, for selecting between a reference clock signal and read data signal; and
   g) an oscillator control circuit having an input coupled to said one-shot circuit, and further having an oscillator disable signal output;
   wherein said one-shot output terminal is coupled to a first one of said phase comparison means input terminals, said VCO output is coupled to a second one of said phase comparison means input terminals, said phase comparison output terminals are coupled to said charge pump input terminals, said charge pump output terminal is coupled to said loop filter, a first one of said VCO input terminals and a first one of said one-shot input terminals, said two-to-one selector circuit output terminal is coupled to a second one of said one-shot input terminals, and said oscillator disable signal is coupled to a second one of said VCO input terminals; and
   wherein said VCO comprises a first ring oscillator further comprising inverters, and an oscillator disable circuit which enables and disables said first ring oscillator as directed by said oscillator disable signal, and said one-shot circuit comprises variable delay means for adjusting pulse width, said variable delay means comprising a second ring oscillator having a frequency that is controlled by the output of said charge pump.

2. The phase synchronization circuit of claim 1, wherein said oscillator disable circuit comprises a voltage fixing switching circuit responsive to said oscillator disable signal; and a transmission circuit, said transmission circuit being disposed between a Kth inverter circuit of said first ring oscillator and a (K+1)th inverter circuit of said first ring oscillator for transmitting signals from the Kth to the (K+1)th inverter, where K is an integer greater than or equal to one.

3. The phase synchronization circuit of claim 2, wherein said variable delay means has the same circuit configuration as said first ring oscillator and oscillator disable circuit including said transmission circuit, wherein the transmission circuits of said variable delay means are always on.

4. The phase synchronization circuit of claim 1, wherein said oscillator disable circuit is provided before a first inverter circuit of said ring oscillator and comprises a transmission circuit which transmits signals from a final stage to said first inverter, and a voltage fixing switching circuit responsive to said oscillator disable signal.

5. The phase synchronization circuit of claim 2, wherein said voltage fixing switching circuit comprises a MOSFET.

6. The phase synchronization circuit of claim 4, wherein said voltage fixing switching circuit comprises a MOSFET.

7. The phase synchronization circuit of claim 1, wherein said loop filter comprises a resistor and a capacitor connected in series.

* * * * *